United States Patent [19]

Fujisaki et al.

[11] Patent Number: 5,204,984
[45] Date of Patent: Apr. 20, 1993

[54] DOWN CONVERTER FOR SATELLITE COMMUNICATION SYSTEM

[75] Inventors: Hirotaka Fujisaki, Neyagawa; Yukiro Kashima, Takatsuki; Akihito Deki, Amagasaki, all of Japan

[73] Assignee: Matsushita Electric Industrial Co., Ltd., Kodoma, Japan

[21] Appl. No.: 788,101

[22] Filed: Nov. 5, 1991

[30] Foreign Application Priority Data

May 11, 1990 [JP] Japan .................................. 2-300798

[51] Int. Cl.$^5$ ............................................. H04B 1/26
[52] U.S. Cl. ................................. 455/319; 455/131; 455/338
[58] Field of Search .............. 455/338, 343, 293, 313, 455/319, 131

[56] References Cited

PUBLICATIONS

Tsushin Kougaku Hando Bukku (Handbook for Electrical Communication Engineers) pp. 581–587; Jul. 1957, Maruzen Co. Ltd.

Primary Examiner—Reinhard J. Eisenzopf
Assistant Examiner—P. Sobutka
Attorney, Agent, or Firm—Ratner & Prestia

[57] ABSTRACT

A down converter device is disclosed which is used in a satellite communication system to convert a microwave signal to an intermediate frequency signal by the use of a standard signal having a frequency range of several to several tens of MHz, and to apply the intermediate frequency signal to a next stage component. The down converter includes a mixer for producing the intermediate frequency signal indicative of a frequency difference between the standard signal and the microwave signal. A separator is provided which includes a first terminal for receiving the intermediate frequency signal, a second terminal for producing and supplying the intermediate frequency signal to the next stage component and for receiving the standard signal from the next stage component, a first filter for separating the standard signal, and a third terminal for producing the standard signal to the mixing means.

6 Claims, 2 Drawing Sheets

DOWN CONVERTER FOR SATELLITE COMMUNICATION SYSTEM

BACKGROUND OF THE INVENTION

1. Field of the Invention

The present invention relates to a down converter for use in satellite communication system and, more particularly, to a down converter for microwave digital satellite communication.

2 Description of the Prior Art

The Local signal used for frequency conversion by the down converter in a microwave digital satellite communication system requires a high quality in terms of frequency probability, frequency stability, phase noise characteristic or the like.

One prior art down converter DC' is described below with reference to the FIG. 2.

A microwave signal MS of a frequency such as 12 GHz is input to a microwave low noise amplifier 5 through a microwave input terminal 1. The low noise amplifier 5 amplifies the inputted signal MS and produces an amplified micro wave signal MSa. The amplified microwave signal MSa is input to a mixing circuit 6.

Through an input terminal 3, a standard signal SS' having a frequency in the order of MHz is inputted to a phase locked oscillator (PLO) 9 which produces a phase synchronized signal SSs' having a frequency such as 2.15 GHz. The phase synchronized signal SSs' is input to a frequency multiplier (FM) 8 which produces a local signal SSl' of a microwave band at a frequency range of ten GHz by multiplying the signal SSs' by, e.g. five (2.15 GHz×5=10.75 GHz). The local signal SSl' is input to the mixing circuit 6.

In the mixing circuit 6, a frequency difference between the amplified microwave signal MSa and the local signal SSl' is obtained to produce an intermediate frequency signal IF' having a frequency range of, for example, 950 MHz. The intermediate frequency signal IF' is input to an intermediate frequency amplifier 7 and is thereby amplified. The amplified intermediated frequency IFa' is produced from an output terminal 2. Through a DC source terminal 4, an electric power DC is supplied to a power source (PS) circuit 10 for driving the down converter DC'.

According to the prior art down converter DC', terminals 2, 3 and 4 are provided for connection with a next stage circuit component, such as a receiver. Thus, if a cable is used, a 3-line cable is necessary to connect terminals 2, 3, and 4 to the next stage component.

As a result, the conventional down converter DC' as described above requires a number of lines in a cable, or a number of separate cables are necessary for connection with the next stage component, resulting in difficulties of installation and maintenance, degradation of reliability, and the increase of the cost of the down converter.

SUMMARY OF THE INVENTION

The present invention has been developed with a view to substantially solving the above described disadvantages and has for its essential object to provide an improved down converter for use in a satellite communication system.

In order to achieve the aforementioned objective, a down converter for converting a microwave signal to an intermediate frequency signal by the use of a standard signal having a frequency range of several to several tens of MHz, and for applying the intermediate frequency signal to a next stage component comprises a mixing means for producing the intermediate frequency signal indicative of a frequency difference between the standard signal and the microwave signal and a separator means. The separator means comprises a first terminal for receiving the intermediate frequency signal, a second terminal for producing and supplying the intermediate frequency signal to the next stage component and for receiving the standard signal from the next stage component, a first filter means for separating standard signal, and a third terminal for producing the standard signal to the mixing means.

BRIEF DESCRIPTION OF THE DRAWINGS

These and other objects and features of the present invention will become clear from the following description taken in conjunction with the preferred embodiment thereof with reference to the accompanying drawings throughout which like parts are designated by like reference numerals, and in which.

DETAILED DESCRIPTION OF THE PREFERRED EMBODIMENTS

Figure 1:
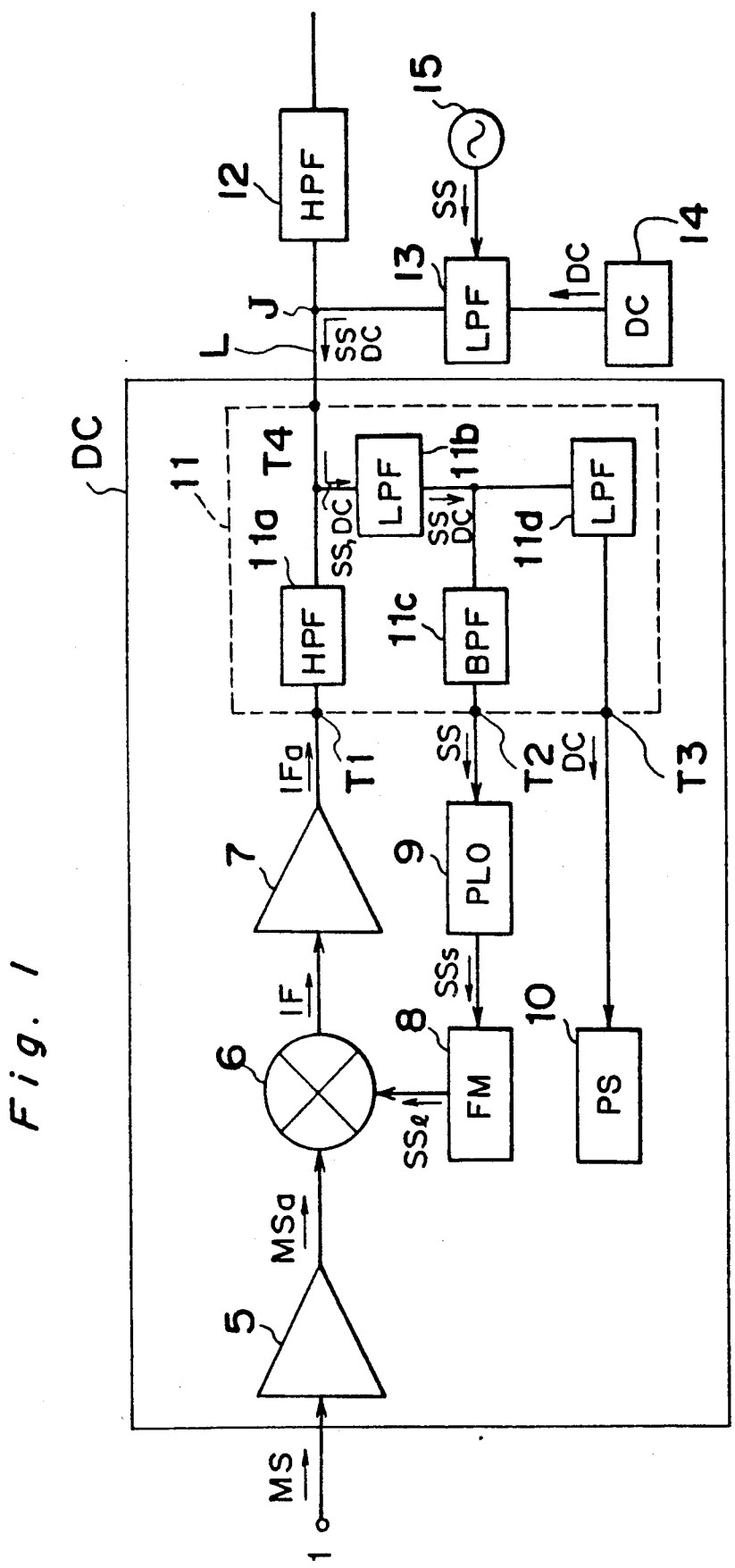
FIG. 1 is a block diagram of a down converter for use in a satellite communication system according to the present invention.
Figure 2:
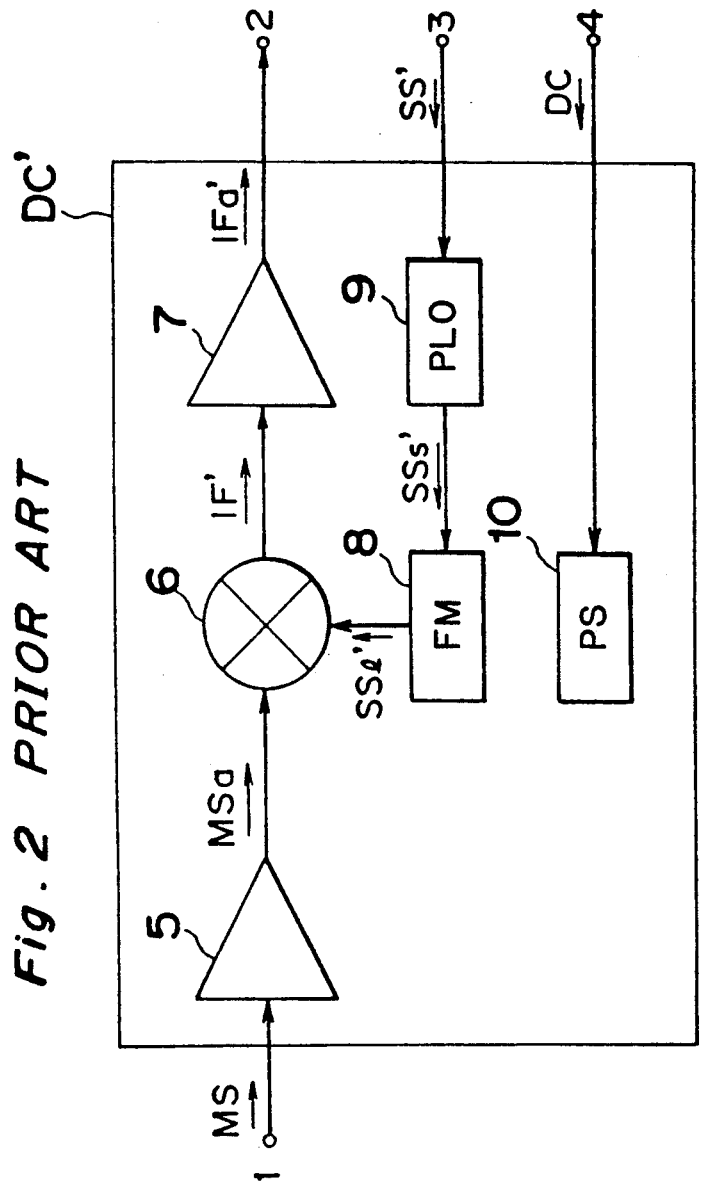
FIG. 2 is a block diagram of a conventional down converter for use in a satellite communication system.

Referring to FIG. 1, a down converter DC for use in a satellite communication system according to the present invention is shown.

A microwave input terminal 1 is connected to a low noise amplifier 5. The low noise amplifier 5 is further connected to a mixing circuit 6 which is in turn connected to an intermediate frequency amplifier 7. The intermediate frequency amplifier 7 is then connected to a signal separator 11 which has four terminals T1, T2, T3 and T4. Terminal T1 is connected to intermediate frequency amplifier 7. Terminal T2 is connected to a phase synchronizing oscillator 9 and in turn to a frequency multiplier 8, which is further connected to mixing circuit 6. Terminal T3 is connected to a power source circuit 10. And, terminal T4 is connected to a Junction J which is connected to a high pass filter 12 and a low pass filter 13. Low pass filter 13 is further connected to a DC generator 14 and a standard signal generator 15 which generates a standard signal having a frequency of several to several tens MHz.

According to the present invention, the down converter DC is defined by circuits 5, 6, 7, 8, 9, 10 and 11. The circuits 12, 13, 14 and 15 are provided in a next stage component, such as a receiver. The connection between the down converter DC and the receiver, i.e., between terminal T4 and junction J is done by a single line cable L.

The signal separator 11 includes a high pass filter 11a, a first low pass filter 11b, a band pass filter 11c, and a second low pass filter 11d.

In operation, a standard signal SS having a frequency of several to several tens MHz, for example 10 MHz is generated from a standard signal generator 15. The standard signal SS and a DC current from DC generator 14 are supplied to low pass filter 13. Thus, the DC current and the standard signal are transmitted from junction J to terminal T4 through a line L. Because of the high pass filter 12, the standard signal SS and the DC current will not be transmitted to the next stage circuit connected to high pass filter 12.

In the signal separator 11, the standard signal SS and DC current are transmitted through the first low pass filter 11b and are separated by band pass filter 11c and the second low pass filter 11d. Thus, the band pass filter 11c produces the standard signal SS of 10 MHz to PLO 9 through terminal T2, and the second low pass filter 11d provides the DC current to the power source circuit 10 through terminal T3.

In the PLO 9, a phase synchronized signal SSs (2.15 GHz) is produced with reference to the standard signal SS (10 MHz) and is applied to frequency multiplier 8. In the frequency multiplier 8, the phase synchronized signal SSs is multiplied, e.g., by five, so that a local signal SSl (10.75 GHz) is applied to mixing circuit 6.

In the meantime, a microwave signal MS having a high frequency range, such as in the order of 12 GHz, is input to a microwave low noise amplifier 5 through a microwave input terminal 1 and further applied to mixing circuit 6.

In the mixing circuit 6, a frequency difference between the amplified microwave signal MSa (about 12 GHz) and the local signal SSl (10.75 GHz) is obtained to produce an intermediate frequency signal IF which has a frequency in the range of 950 to 1450 MHz. The intermediate frequency signal IF is input to intermediate frequency amplifier 7 and further to the frequency distributor 11 through terminal T1.

The amplified IF signal IFa passes through high pass filter 11a, and is further applied through line L to high pass filter 12.

It is noted that the IF signal IFa will not pass through low pass filters 11b and 13.

As fully described above, the down converter DC according to the present invention requires only one cable line L for the connection between the down converter DC and the next stage component, such as a receiver. Thus, the down converter DC according to the present invention has a great convenience in its practical use.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A down converter for converting a microwave signal to an intermediate frequency signal by the use of a standard signal having a frequency range of several to several tens of MHz, and for applying said intermediate frequency signal to a next stage component, said down converter comprising:
    a mixing means for producing said intermediate frequency signal indicative of a frequency difference between said standard signal and said microwave signal; and
    a separator means comprising:
        a first terminal for receiving said intermediate frequency signal;
        a second terminal for producing and supplying said intermediate frequency signal to said next stage component and for receiving said standard signal from said next stage component;
        a first filter means for separating said standard signal from said intermediate frequency signal; and
        a third terminal for producing said standard signal to said mixing means.

2. A down converter as claimed in claim 1, wherein said second terminal further receives a DC current from said next stage, and wherein separator means further comprises a second filter means for separating said DC current, and a fourth terminal for producing said DC current.

3. A down converter as claimed in claim 2, further comprising a DC supply means connected to said fourth terminal.

4. A down converter as claimed in claim 1, wherein said second terminal is adapted for connection with a single line cable through which said intermediate frequency signal and said standard signal are transmitted in opposite directions.

5. A down converter as claimed in claim 2, wherein said second terminal is adapted for connection with a single line cable through which said intermediate frequency signal and a combined signal of said standard signal and DC current are transmitted in opposite directions.

6. A down converter as claimed in claim 1, wherein said mixing means comprises a phase synchronizing oscillation means for synchronizing said standard signal before being mixed with said microwave signal.

* * * * *

UNITED STATES PATENT AND TRADEMARK OFFICE
CERTIFICATE OF CORRECTION

PATENT NO. : 5,204,984
DATED : April 20, 1993
INVENTOR(S) : Hirotaka Fujisaki et al.

It is certified that error appears in the above-indentified patent and that said Letters Patent is hereby corrected as shown below:

On the title page, item [73], change "Kodoma" to --Kadoma--.

Signed and Sealed this

Fourteenth Day of December, 1993

Attest:

BRUCE LEHMAN

*Attesting Officer*     *Commissioner of Patents and Trademarks*